(12) United States Patent
Li et al.

(10) Patent No.: US 11,780,265 B2
(45) Date of Patent: Oct. 10, 2023

(54) TRUCKLE STRUCTURE AND CABINET

(71) Applicant: ZHEJIANG SHIP ELECTRONICS TECHNOLOGY CO., LTD, Ningbo (CN)

(72) Inventors: Yongping Li, Ningbo (CN); Xianwei Luo, Ningbo (CN)

(73) Assignee: ZHEJIANG SHIP ELECTRONICS TECHNOLOGY CO., LTD, Ningbo (CN)

( * ) Notice: Subject to any disclaimer, the term of this patent is extended or adjusted under 35 U.S.C. 154(b) by 743 days.

(21) Appl. No.: 15/733,386

(22) PCT Filed: Dec. 25, 2018

(86) PCT No.: PCT/CN2018/123512
§ 371 (c)(1),
(2) Date: Jul. 17, 2020

(87) PCT Pub. No.: WO2019/144748
PCT Pub. Date: Aug. 1, 2019

(65) Prior Publication Data
US 2020/0346490 A1 Nov. 5, 2020

(30) Foreign Application Priority Data

Jan. 23, 2018 (CN) .......................... 201810064964.0
May 16, 2018 (CN) .......................... 201810465377.2

(51) Int. Cl.
*B60B 33/06* (2006.01)
*B60B 33/00* (2006.01)

(52) U.S. Cl.
CPC .......... *B60B 33/06* (2013.01); *B60B 33/0028* (2013.01)

(58) Field of Classification Search
CPC ...... B60B 33/06; B60B 33/006; B60B 33/028
See application file for complete search history.

(56) References Cited

U.S. PATENT DOCUMENTS 1,092,506 A * 4/1914 Oldroyd .................. B60B 33/06
16/34
5,253,389 A * 10/1993 Colin ..................... B60B 33/066
16/34
(Continued)

FOREIGN PATENT DOCUMENTS

CN        2304543        1/1999
CN      201086599        7/2008
(Continued)

OTHER PUBLICATIONS

International Search Report dated Mar. 26, 2019 from PCT Application No. PCT/CN2018/123512.

*Primary Examiner* — Daniel J Rohrhoff
(74) *Attorney, Agent, or Firm* — INNOVATION CAPITAL LAW GROUP, LLP; Vic Lin

(57) ABSTRACT

Provided are a truckle structure and a cabinet. The truckle structure comprises: a truckle and a support, wherein the truckle includes a mounting base and a wheel rotatably mounted on the mounting base; the support is composed of a mounting portion located at a lower middle position as well as two connecting portions respectively located on two sides of the mounting portion; the two connecting portions are formed in a manner that the left side and the right side of the mounting portion are upwards bent towards the middle, the support is rotatably connected to the mounting base through the two connecting portions, and the mounting base is located between the two connecting portions; and a mounting hole is formed in the mounting portion, center of the mounting hole and center of gravity of the truckle are on a same straight line, and center of gravity of the support deviates from the straight line. The truckle structure can be directly mounted on the ground and is firmer and more durable.

15 Claims, 10 Drawing Sheets

(56) References Cited

U.S. PATENT DOCUMENTS

| | | | | |
|---|---|---|---|---|
| 8,539,640 | B1 * | 9/2013 | Waggener | B60B 33/02 |
| | | | | 16/35 R |
| 9,757,980 | B1 * | 9/2017 | Jones | B60B 33/04 |
| 2006/0277715 | A1 * | 12/2006 | Lin | B60B 33/0049 |
| | | | | 16/22 |
| 2009/0119878 | A1 * | 5/2009 | Chou | B60B 33/0057 |
| | | | | 16/35 R |
| 2018/0319213 | A1 * | 11/2018 | Doerflinger | B60B 33/025 |
| 2019/0070899 | A1 * | 3/2019 | Hugues | B60B 33/028 |
| 2022/0048320 | A1 * | 2/2022 | Lazzarino | B62B 5/049 |
| 2023/0001740 | A1 * | 1/2023 | Spoelstra | B60B 33/0028 |

FOREIGN PATENT DOCUMENTS

| | | | | |
|---|---|---|---|---|
| CN | 202524667 | U | | 11/2012 |
| CN | 206166417 | U | | 5/2017 |
| CN | 107415583 | A | * | 12/2017 |
| CN | 108200741 | A | | 6/2018 |
| CN | 108422807 | A | | 8/2018 |
| CN | 207720577 | U | | 8/2018 |
| CN | 113291097 | A | * | 8/2021 |
| EP | 3112184 | A1 | * | 1/2017 ......... B60B 33/0089 |
| EP | 3112184 | A1 | | 1/2017 |
| JP | 2014058251 | A | | 4/2014 |

* cited by examiner

TRUCKLE STRUCTURE AND CABINET

BACKGROUND OF THE INVENTION

1. Technical Field

The present invention belongs to the technical field of cabinets, and relates to a truckle structure and a cabinet.

2. Description of Related Art

With the rapid development of digital construction, cabinets, as important data communication processing devices, have been widely applied to the fields of communication, network data processing, and the like.

Frames of the cabinets on the present market are simply designed in structure and are directly formed by splicing thin profiles. Most profiles spliced among a top frame, a bottom frame, and stand columns are connected in an insertion manner. For example, the profiles are directly inserted into the top frame, the bottom frame, and the stand columns, or are connected to the top frame, the bottom frame, and the stand columns through tee joints. In this case, it is necessary to mount cross beams between every two stand columns to guarantee the support strength of the whole cabinet frames. However, after the cross beams are mounted on the cabinet frames, due to limitation of an inserted connection manner or a splicing connection manner, the whole cabinet frames still have insufficient support strength/structural rigidity and may swing to a certain extent under an external force. In addition, existing stand columns are simple and slim in structure, and have insufficient structural strength and rigidity; after the cross beams are additionally mounted in the middle of sides of the cabinets, cable arrangement in the whole cabinets will be influenced; and the cross beams may also influence the installation and layout of cable arrangement structures and obstruct device channels.

Furthermore, existing cabinets mounted with common truckles capable of moving freely cannot be directly transported or used, wooden pallets need to be additionally used during transportation of the existing cabinets, and support legs need to be additionally used when the existing cabinets are used by customers. Most cabinets on the present market are additionally mounted, near the truckles, with the support legs required to be directly fixed to the cabinets to guarantee a fixing effect, and in this case, the support legs fail to be closely connected to the truckles. Consequentially, the firmness is not good.

In summary, the present invention provides a firmer and more durable truckle structure which can be directly mounted on the ground and a cabinet using the truckle structure.

BRIEF SUMMARY OF THE INVENTION

The objective of the present invention is to solve the above problems of the prior art by providing a firmer and more durable truckle structure capable of being directly mounted on the ground, and a cabinet.

The above-mentioned objective of the present invention is fulfilled through the following technical solution: a truckle structure comprises:

A truckle including a mounting base and a wheel which is rotatably mounted on the mounting base;

A support composed of a mounting portion located at a lower position as well as two connecting portions respectively located on two sides of the mounting portion, wherein the two connecting portions are formed in a manner that the left side and the right side of the mounting portion are upwards bent towards the middle, the support is rotatably connected to the mounting base through the two connecting portions, and the mounting base is located between the two connecting portions; and a mounting hole is formed in the mounting portion, center of the mounting hole and center of gravity of the truckle are on a same straight line, and center of gravity of the support deviates from the straight line.

As a further improvement of the present invention, the mounting base has flat side faces, and upper portions of the connecting portions are formed as flat plates which correspondingly abut against the flat side faces of the mounting base.

As a further improvement of the present invention, the two connecting portions of the support are rotatably connected to the mounting base through a screw rod.

As a further improvement of the present invention, latch holes are coaxially formed in the mounting base and the connecting portions respectively.

A cabinet comprises the truckle structure.

As a further improvement of the present invention, independent truckle structures are respectively mounted at corners of the cabinet, and mounting bases are detachably connected to the corners of the cabinet.

A cabinet having at least one corner detachably provided with the truckle structure.

A cabinet having at least one corner detachably provided with the truckle structure. The cabinet comprises:

A top frame having corners respectively formed with first mounting notches, wherein each first mounting notch has two first mounting surfaces connected to the top frame;

A bottom frame having corners respectively formed with second mounting notches in one-to-one correspondence with the first mounting notches, wherein each second mounting notch has two second mounting surfaces connected to the bottom frame; and Stand columns used to connect the top frame to the bottom frame and in one-to-one correspondence with the first mounting notches, wherein mounting positions of the stand columns are matched with the mounting notches in shape; and one stand column is mounted between each first mounting notch and the corresponding second mounting notch, so that the stand column is closely connected to the corresponding first mounting surface and the corresponding second mounting surface.

As a further improvement of the cabinet, the mounting notches are right-angled, an included angle between two corresponding first mounting surfaces is a right angle, an included angle between two corresponding second mounting surfaces is a right angle, and mounting positions, corresponding to the mounting notches, of the stand columns are square.

As a further improvement of the cabinet, the top frame and the bottom frame respectively have four corners, and the mounting notches are respectively formed in the corners.

As a further improvement of the cabinet, the mounting surfaces are sunk into the corresponding top frame/bottom frame.

As a further improvement of the cabinet, the stand columns are hollow.

As a further improvement of the cabinet, the stand columns are made from steel sheets.

As a further improvement of the cabinet, the stand columns can be bent for multiple times.

As a further improvement of the cabinet, when a plurality of cabinets are arranged, two adjacent cabinets are closely fixed to each other, in this case, two corresponding top frames/bottom frames are in close fit with each other, and are simultaneously mounted together through the stand columns in the middle.

Based on the above technical solution, the present invention at least has the following technical effects:

1. The truckle structure is compact in layout and ingenious in design, and is additionally provided with the quasi-triangular support on a traditional truckle. A product can be directly mounted on the ground via the mounting hole in the support. Moreover, the product using the truckle structure can be directly transported by an ordinary forklift, so that a wooden pallet is omitted, and the transportation cost is lowered; and normally, when the product is used by customers, it is unnecessary to use support legs, so that an additional mounting cost is lowered. The truckle needs to bear a force to a certain extent, so that the triangular support of the present invention is firmer and more durable compared with that of a common locking truckle. The mounting hole in the support is at the same straight line as the center of gravity of the product; the whole triangular support is eccentric and is not prone to rotating in one direction under an eccentric effect when supporting the product; and the support is connected to the upper portion of the independent truckle in an articulated manner. Accordingly, a product supported by four truckle structures will not turn over in the same direction, so that support reliability is guaranteed. Furthermore, because the triangular support has two rotating directions from the supporting state to the moving state and the eccentric design is adopted, the support can only rotate towards one side, so that the other side of the support has a fool-proof function, and the whole truckle can rotate freely.

2. A frame of the cabinet of the present invention is composed of the top frame, the bottom frame, and the stand columns for connecting the top frame to the bottom frame. By means of a structural improvement on the cabinet frame, the strength and rigidity of the whole cabinet frame are guaranteed, a cross beam connected between every two stand columns of existing cabinets is omitted, the spatial layout of the cabinet frame is optimized to obtain a more compact structure, the cabinet has better stability when mounted and used, the whole cabinet frame provides more reliable support, the cabinet frame without the cross beams fulfills more convenient and flexible cable arrangement, and the truckle structures are mounted at the corners of the cabinet frame, so that mounting convenience, firmness, and reliability are achieved.

BRIEF DESCRIPTION OF THE SEVERAL VIEWS OF THE DRAWINGS

The specific implementations of the present invention are further expounded below with reference to the accompanying drawings. Wherein.

Reference Signs: 100, truckle; 110, mounting base; 120, wheel; 200, support; 210, mounting portion; 211, mounting hole; 220, connecting portion; 300, locknut; 400, latch hole; 500, cabinet; 510, top frame; 511, first mounting notch; 5111, first mounting surface; 520, bottom frame; 521, second mounting notch; 5211, second mounting surface; 530, stand column.

DETAILED DESCRIPTION OF THE INVENTION

The technical solution of the present invention is further expounded below with reference to the specific embodiments and accompanying drawings, and the following embodiments are not intended to limit the present invention.

Figure 1:
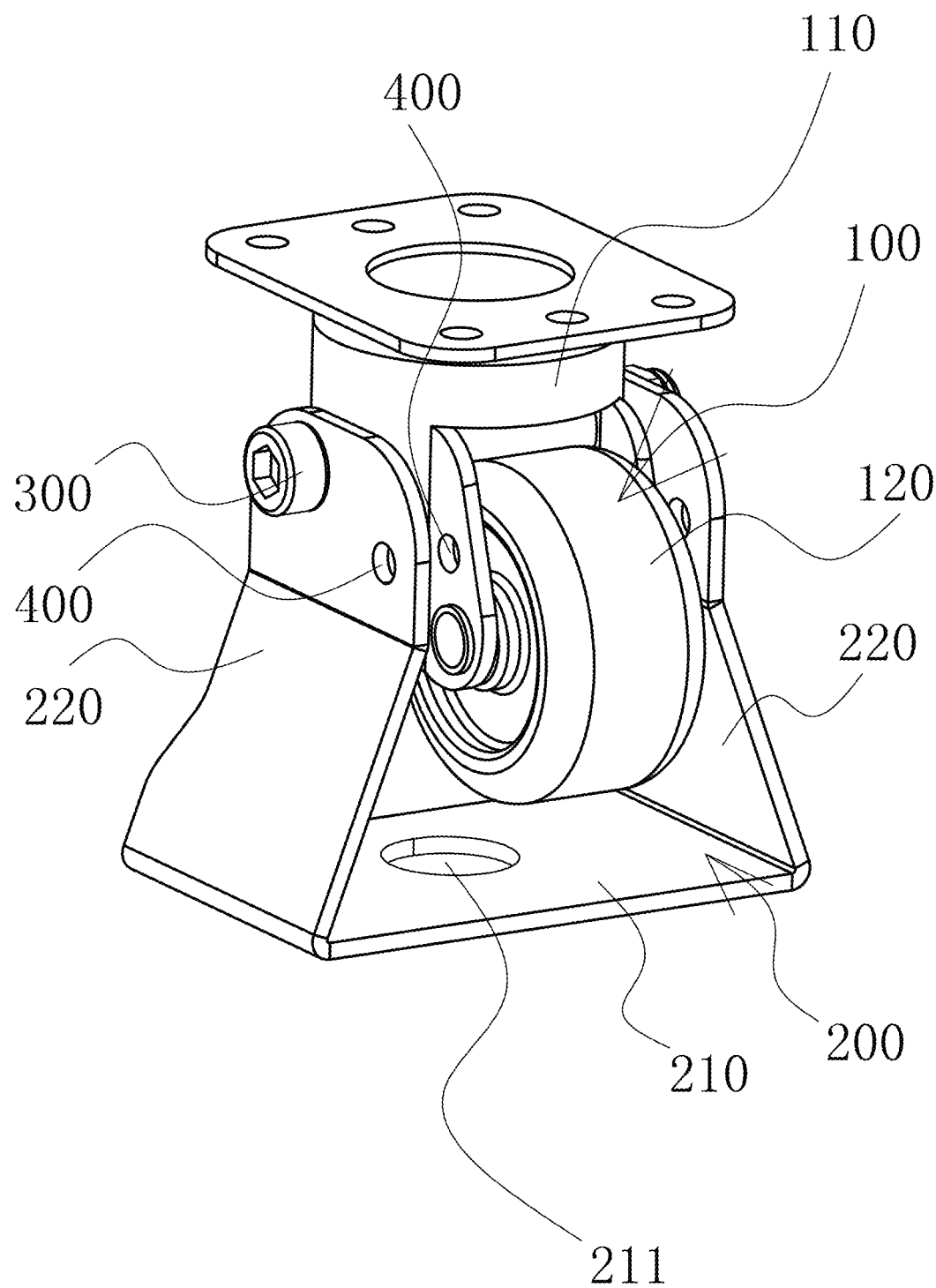
FIG. 1 is a schematic diagram of a truckle structure in a supporting state in a preferred embodiment of the present invention.
Figure 2:
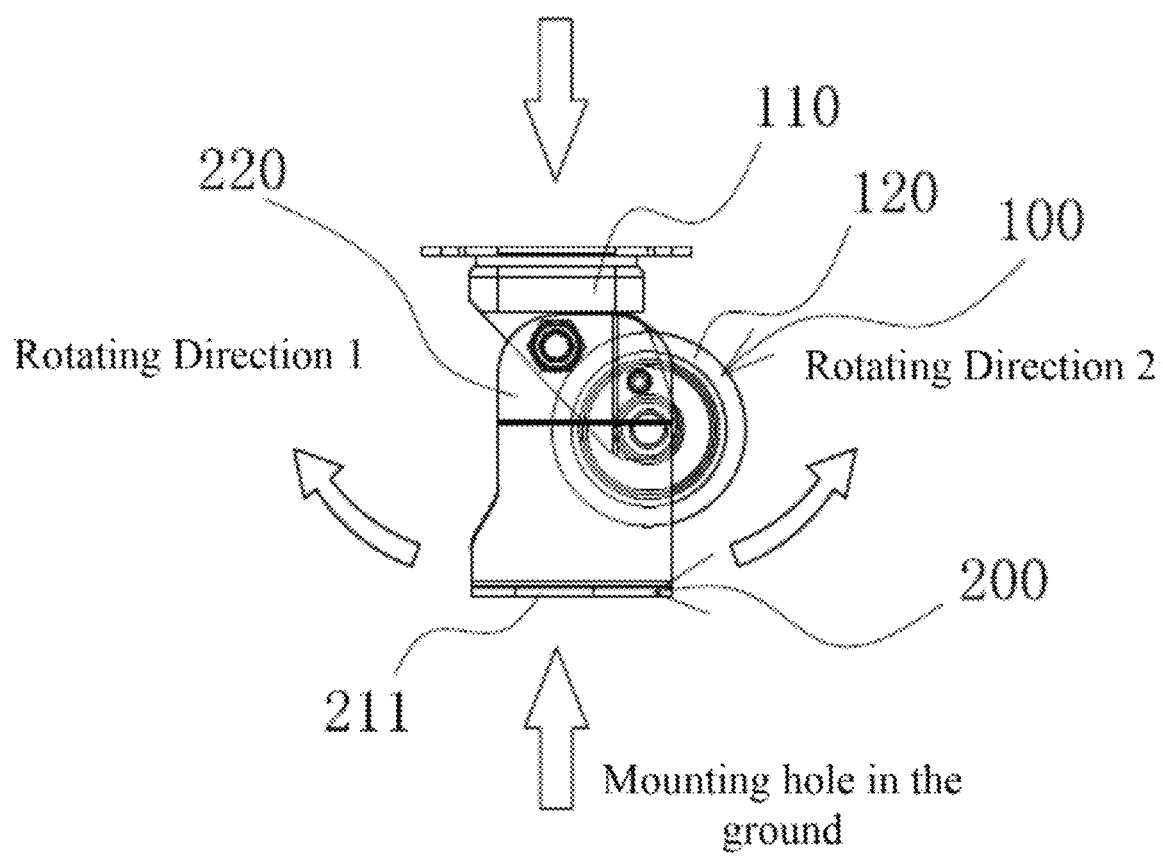
FIG. 2 is a perspective view of FIG. 1.
Figure 3:
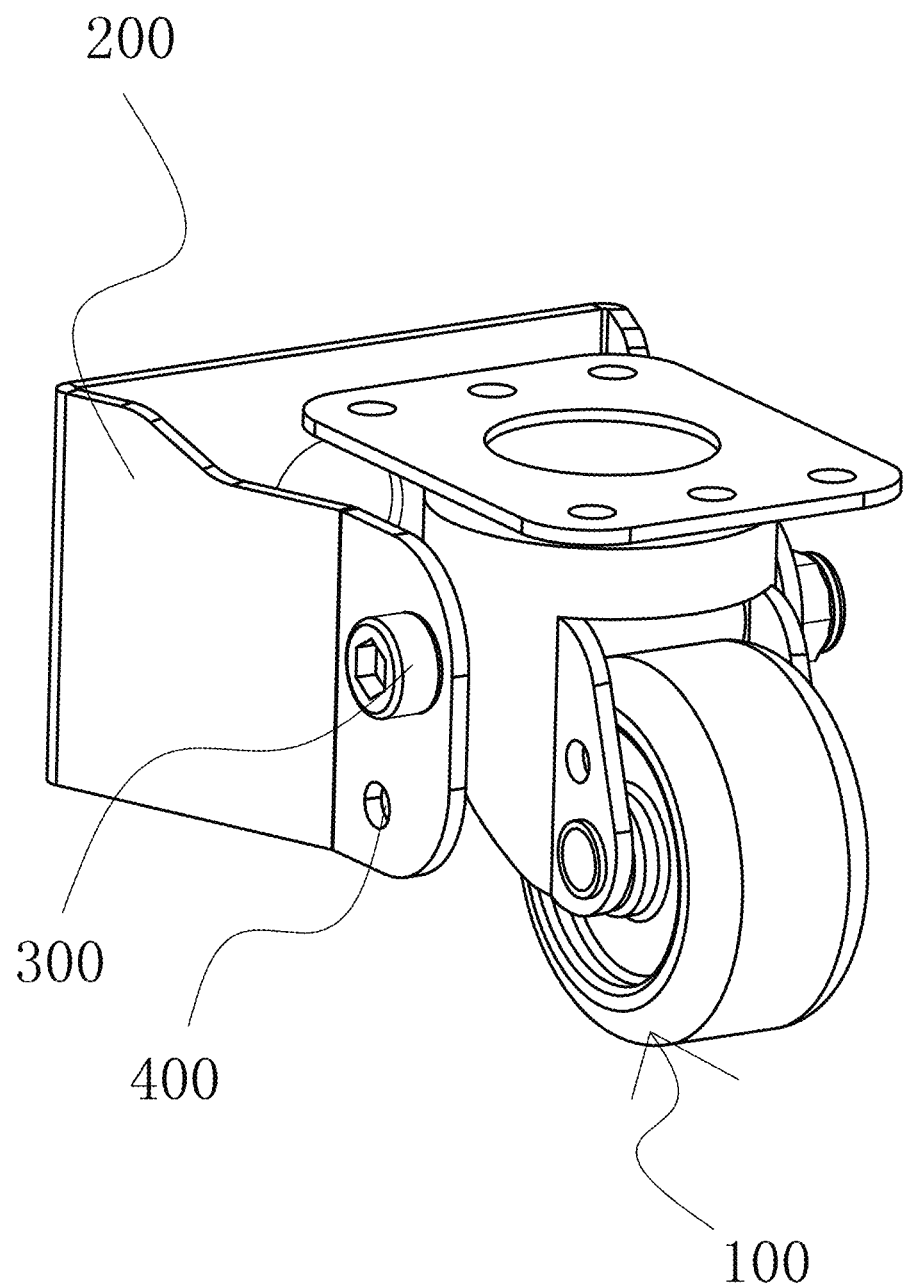
FIG. 3 is a schematic diagram of the truckle structure placed horizontally in the preferred embodiment of the present invention.
Figure 4:
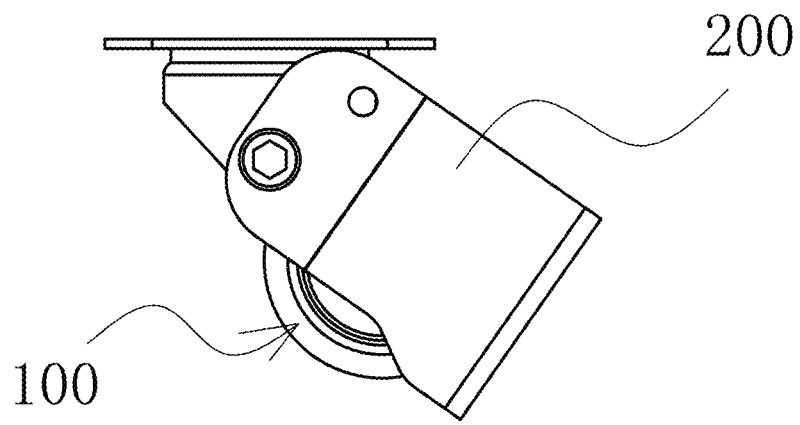
FIG. 4 is a schematic diagram of the truckle structure rotated to a fool-proof side in the preferred embodiment of the present invention.
Figure 5:
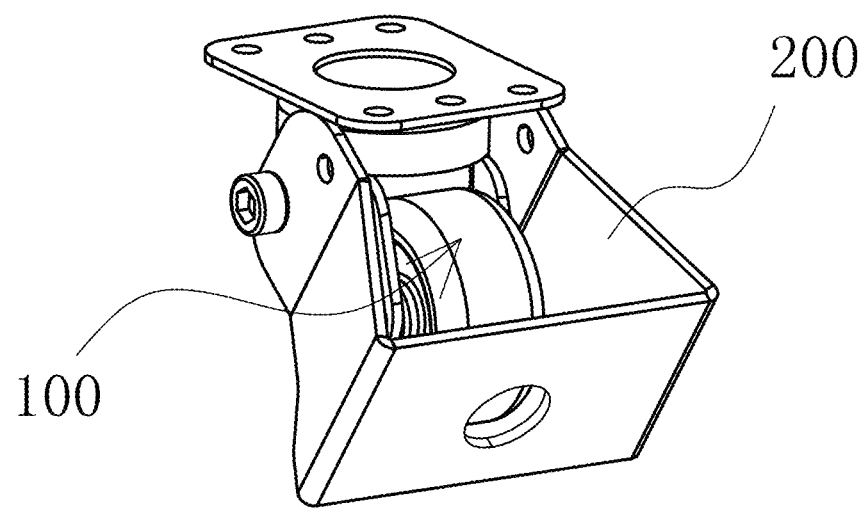
FIG. 5 is a schematic diagram of FIG. 4 from another perspective.
Figure 6:
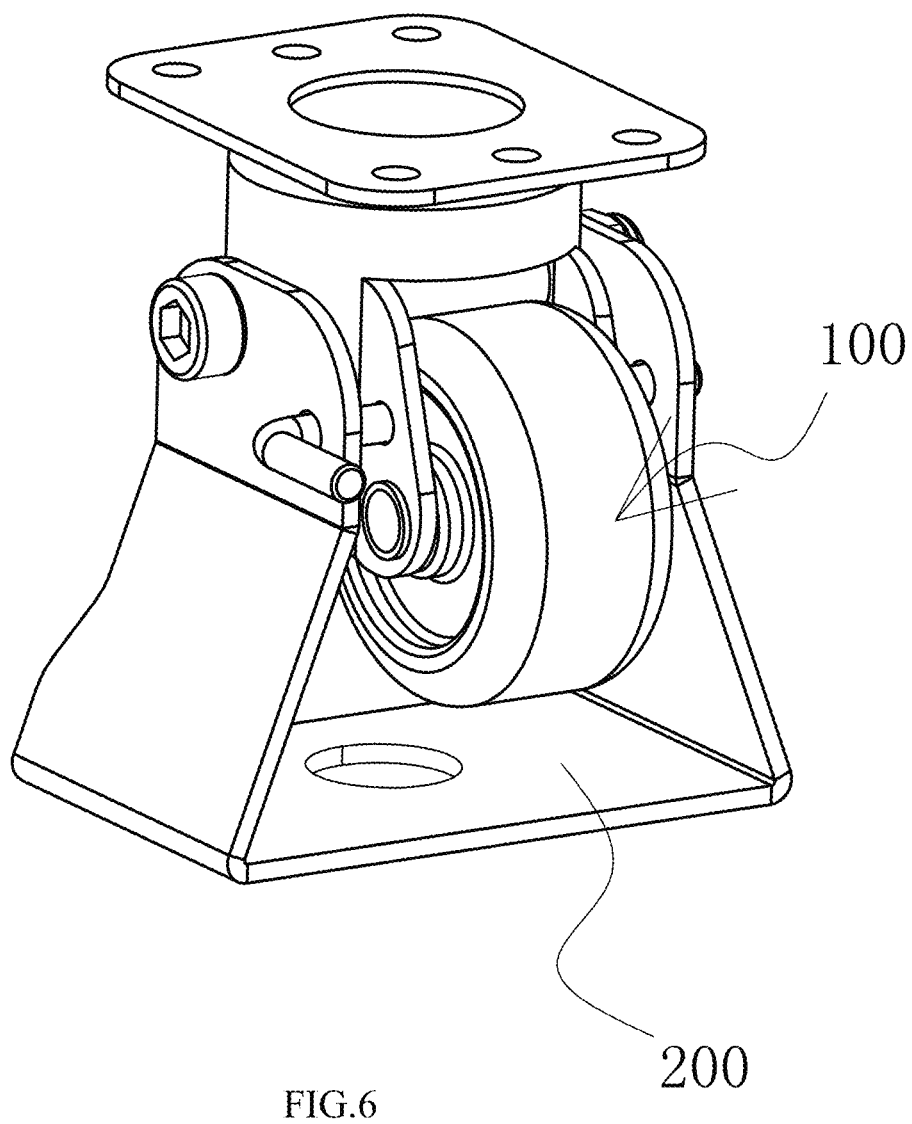
FIG. 6 is a schematic diagram of the truckle structure having a latch inserted thereinto in the preferred embodiment of the present invention.
Figure 7:
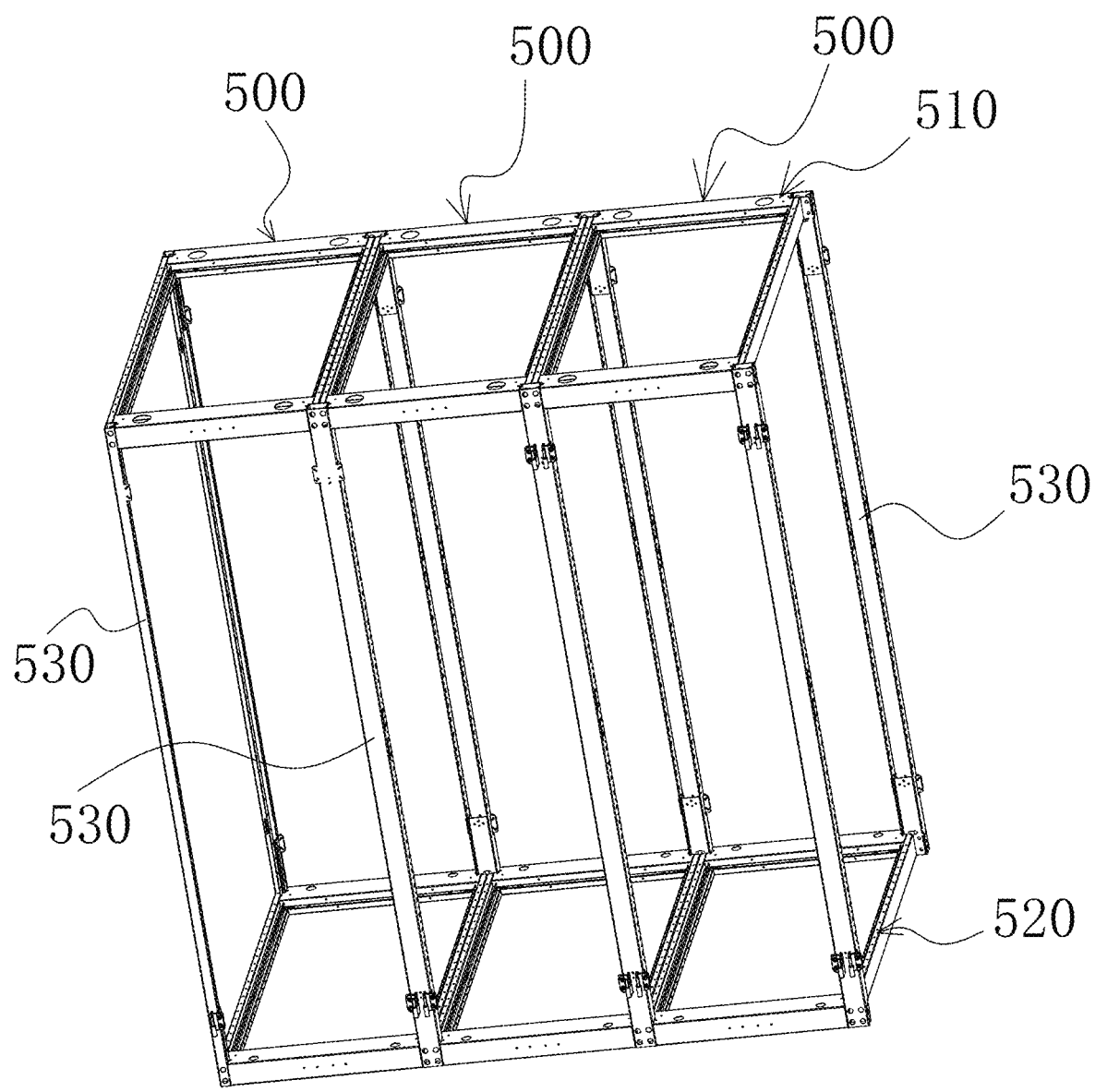
FIG. 7 is a structural diagram of several connected cabinets in a preferred embodiment of the present invention.
Figure 8:
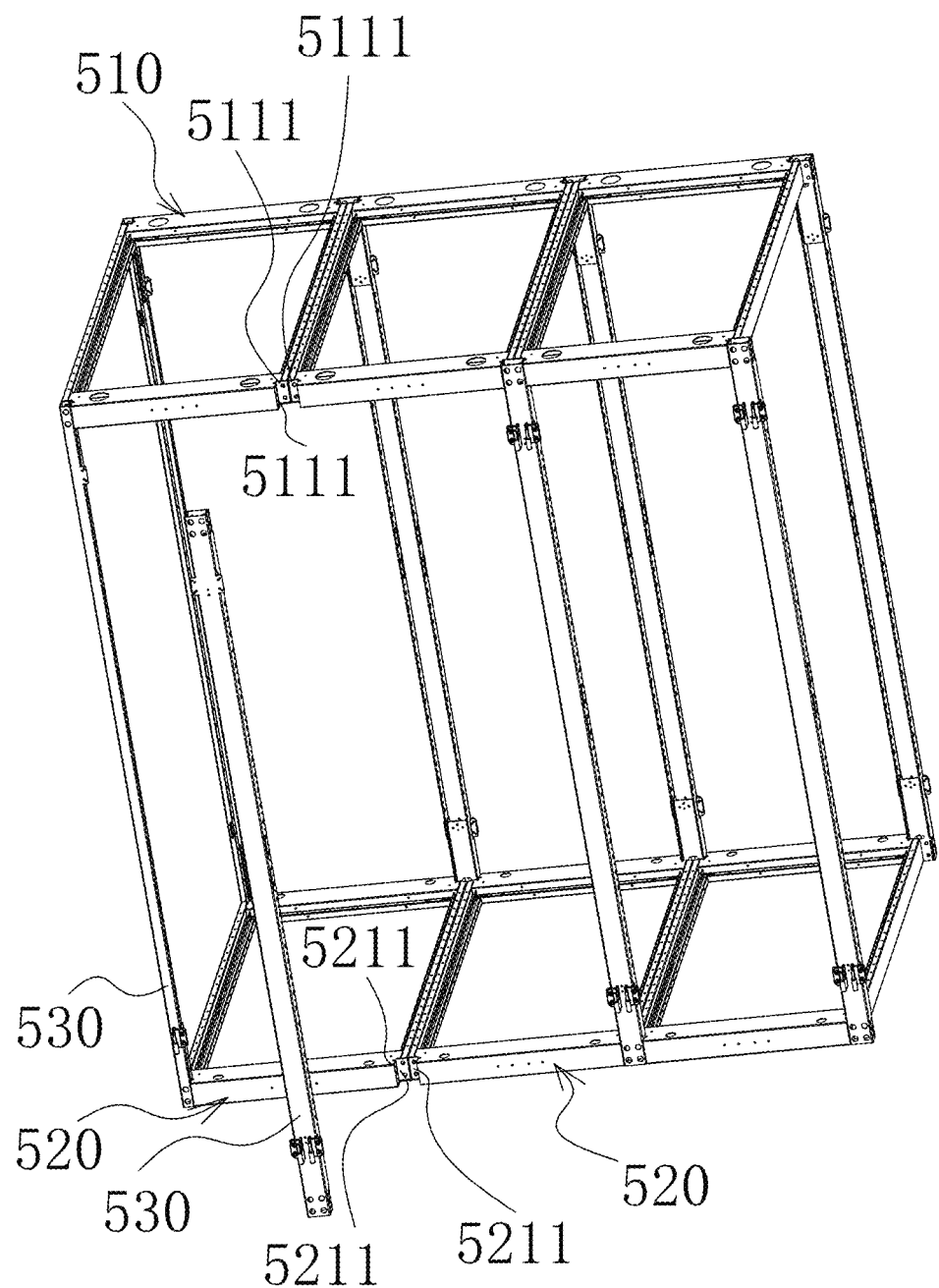
FIG. 8 is an exploded view of FIG. 7.
Figure 9:
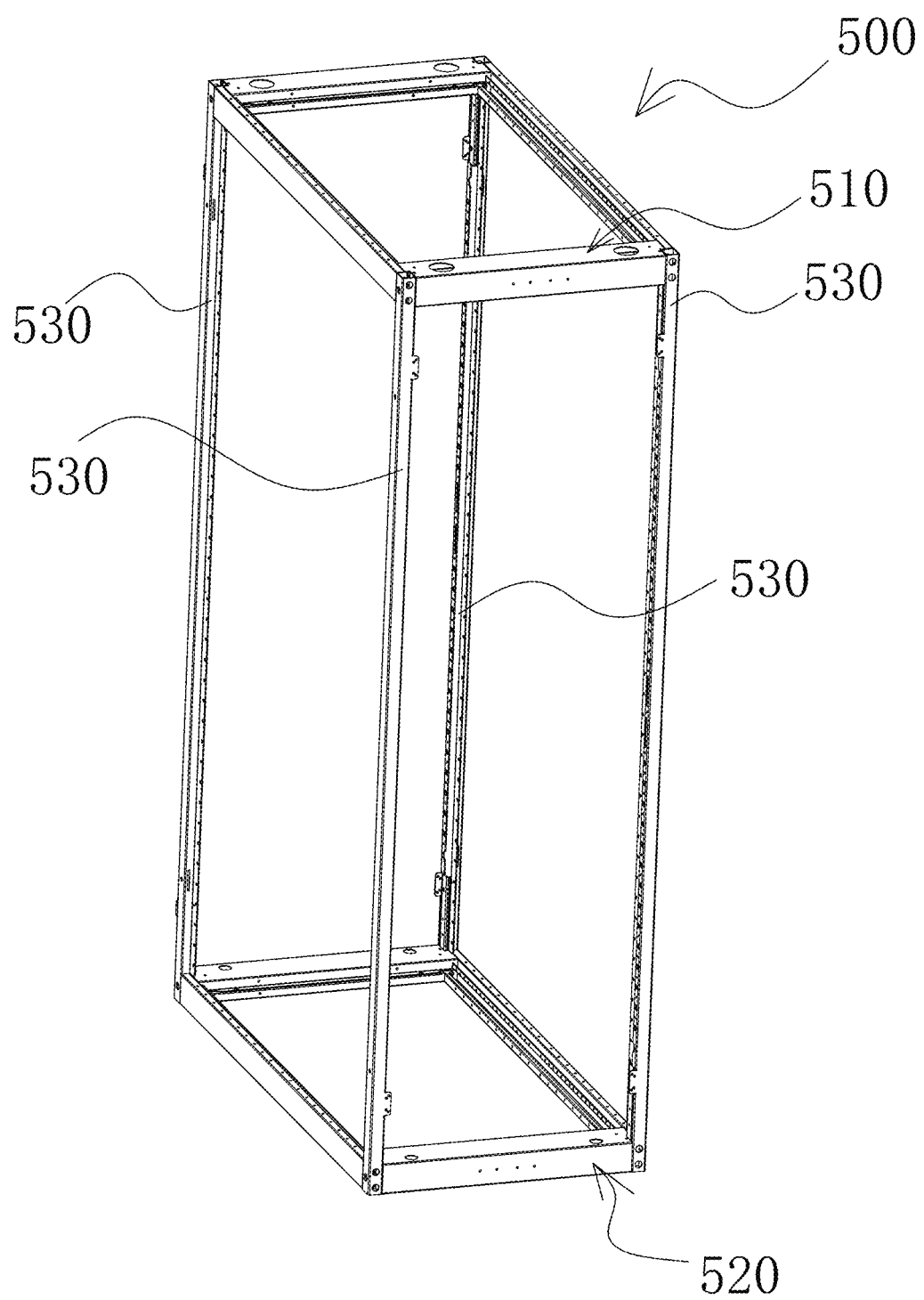
FIG. 9 is a structural diagram of one cabinet in the preferred embodiment of the present invention.
Figure 10:
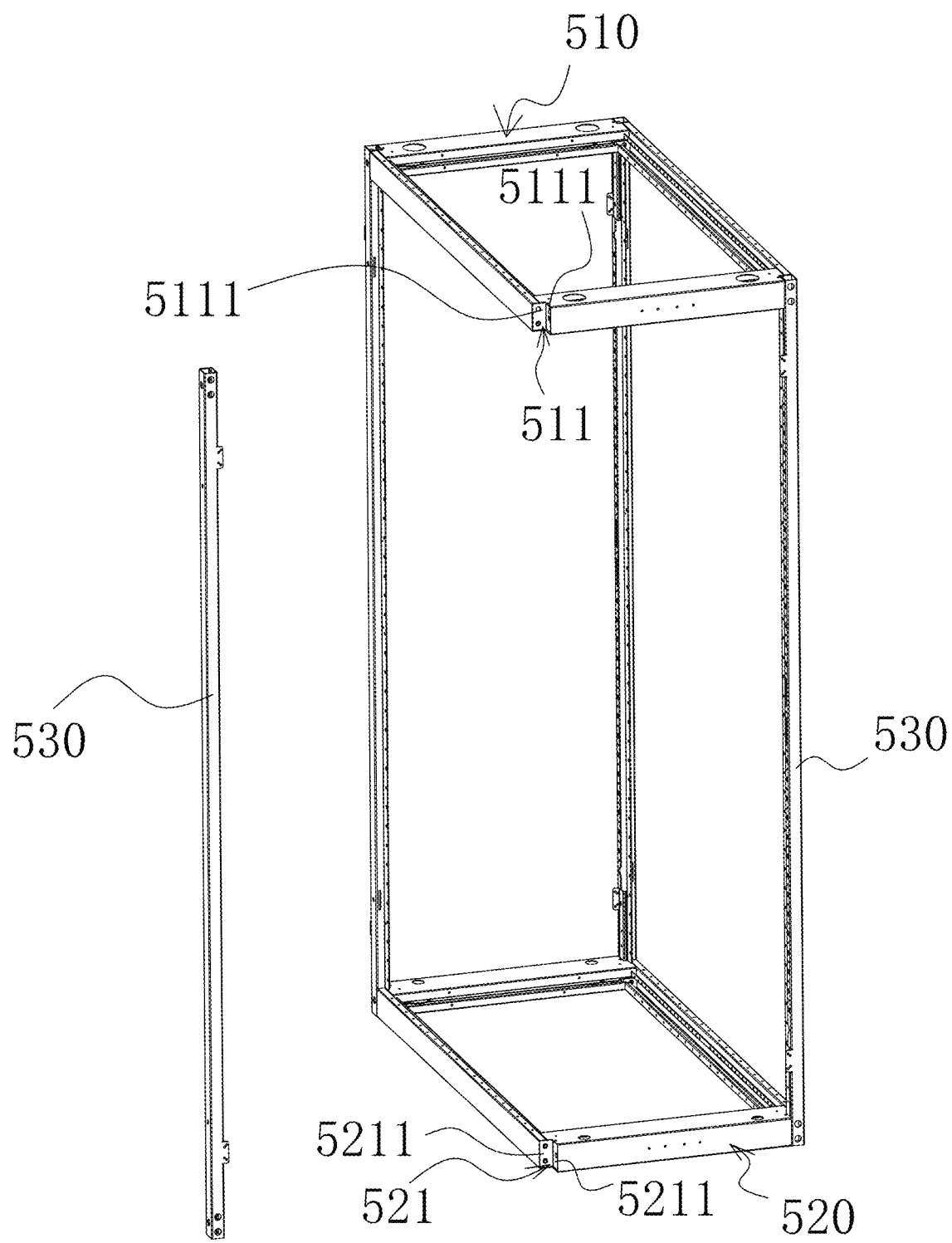
FIG. 10 is an exploded view of FIG. 9.
Figure 11:
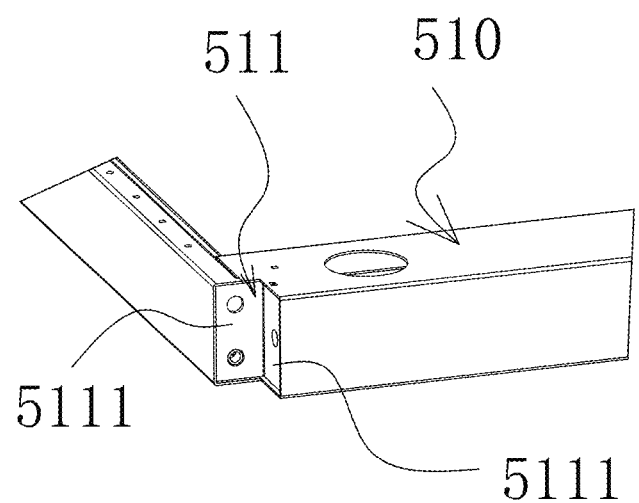
FIG. 11 is an enlarged partial view of FIG. 10.

The technical solution of the present invention is expounded below with reference to FIG. 1 to FIG. 11.

As shown in FIG. 1 to FIG. 6, a truckle structure comprises:

A truckle 100 including a mounting base 110 and a wheel 120 which is rotatably mounted on the mounting base 110 and is preferably located below the mounting base 110;

A support 200 located outside the wheel 120 and compose of a mounting portion 210 located at a lower position as well as two connecting portions 220 respectively located on two sides of the mounting portion 210, wherein the two connecting portions 220 are formed in a manner that the left side and right side of the mounting portion 210 are upwards bent towards the middle, the support 200 is rotatably connected to the mounting base 110 through the two connecting portions 220, and the mounting base 110 is located between the two connecting portions 220; and a mounting hole 211 is formed in the mounting portion 210, center of the mounting hole 211 and center of gravity of the truckle 100 are on a same straight line, and center of gravity of the support 200 deviates from the straight line, that is, the center of gravity of the support 200, center of the mounting hole 211 and center of gravity of the truckle 100 are not on a same straight line.

In the present invention, the mounting portion 210 of the support 200 and the connecting portions 220 are connected into a whole; and the support 200 is preferably formed by sheet metal parts and has the mounting hole 211 (through hole) formed in the middle, thus being firmer and more durable and having a material cost lowered.

The present invention protects a truckle structure, particularly protects a truckle structure for a cabinet. The whole truckle is compact in layout and ingenious in design, is punched based on a traditional truckle, and is additionally provided with the quasi-triangular support 200. A product can be directly mounted on the ground via the mounting hole 211 in the support 200. Moreover, the product using the truckle structure can be directly transported by an ordinary forklift, so that a wooden pallet is omitted, and the transportation cost is lowered; the product can be directly stored in a container to be transported together with a cabinet body, so that the labor cost is lowered; and normally, when the product is used by customers, it is unnecessary to use support legs, so that an additional mounting cost is lowered.

The truckle can bear a force to a certain extent, so that the triangular support 200 of the present invention is firmer and more durable compared with that of a common locking truckle. Moreover, when the wheel 120 needs to be used, the support 200 can be turned to the side to make sure that the wheel 120 rolls on the ground. The support 200 is in close fit with the truckle 100.

The mounting hole 211 in the support 200 is at the same straight line as the center of gravity of the product; the whole triangular support 200 is eccentric and is not prone to rotating in one direction under an eccentric effect when supporting the product; and the support 200 is connected to the upper portion of the independent truckle 100 in an articulated manner. Accordingly, a product supported by four truckle structures will not turn over in the same direction, so that support reliability is guaranteed.

Moreover, Because the triangular support 200 has two rotating directions from the supporting state to the moving state and the eccentric design is adopted, the support can only rotate towards one side, so that the other side of the support 200 has a fool-proof function, which is a behavior restraint function for avoiding corrections and makes operators directly perform correct operation without paying attention or having experience or professional knowledge by means of a restriction method for avoiding mistakes. The whole truckle can rotate freely.

To make sure that the truckle 100 reliably abuts against the support 200 and is rotatably connected to the support 200 stably, and to prevent parts from obstructing one another, preferably, the mounting base 110 has flat side faces, and upper portions of the connecting portions 220 are formed as flat plates which correspondingly abut against the flat side faces of the mounting base 110. By means of such structure, the support stability of the whole product is guaranteed, and the triangular support 200 mainly formed by five bent sheet metal parts is firmer and more durable.

Further, the two connecting portions 220 of the support 200 are rotatably connected to the mounting base 110 through a screw rod, and the screw rod has two ends respectively stretching out of the connecting portions 220 and is fastened by locknuts 300, so that the triangular support 200 is tightened to a certain extent and is prevented against looseness.

Preferably, latch holes 400 are coaxially formed in the mounting base 110 and the connecting portions 220 respectively, in this way, corresponding latches can be directly inserted into the latch holes 400 according to the requirements of the customers, and the triangular support 200 is fully prevented against rotation.

The present invention further protects a cabinet comprising the truckle structure. Further, independent truckle structures are respectively mounted at corners of the cabinet, and mounting bases 110 are detachably connected to the corners of the cabinet. In this way, the cabinet can be transported and used directly, no pallet needs to be used when the cabinet is transported, and the support legs are not needed when the cabinet is used subsequently.

In another preferred embodiment, the present invention provides a cabinet having at least one corner detachably provided with the truckle structure and remaining corners provided with common support legs or common truckles.

As shown in FIG. 7 to FIG. 11, the present invention further protects a cabinet having at least one corner detachably provided with the truckle structure. The cabinet 500 comprises:

A top frame 510 having corners respectively formed with first mounting notches 511, wherein each first mounting notch 511 has two first mounting surfaces 5111 connected to the top frame 510;

A bottom frame 520 having corners respectively formed with second mounting notches 521 in one-to-one correspondence with the first mounting notches 511, wherein each second mounting notch 521 has two second mounting surfaces 5211 connected to the bottom frame 520; and Stand columns 530 used to connect the top frame 510 to the bottom frame 520 and in one-to-one correspondence with the first mounting notches 511, wherein mounting positions of the stand columns 530 are matched with the mounting notches in shape; and one stand column 530 is mounted between each first mounting notch 511 and the corresponding second mounting notch 521, so that the stand column 530 is closely connected to the corresponding first mounting surface 5111 and the corresponding second mounting surface 5211.

Mounting bases 110 of the truckle structures are preferably detachably mounted at the corners of the cabinet composed of the top frame 510, the bottom frame 520, and the stand columns 530.

The cabinet protected by the present invention can be a single cabinet or a multi-connected cabinet device formed by combining a plurality of cabinets, namely a cabinet system (cabinet device) formed after a plurality of cabinets 500 are mounted and connected closely. A frame of the cabinet of the present invention is composed of the top frame 510, the bottom frame 520, and the stand columns 530 for connecting the top frame 510 to the bottom frame 520. By means of a structural improvement on the cabinet frame, the strength and rigidity of the whole cabinet frame are guaranteed, a cross beam connected between every two stand columns 530 of existing cabinets is omitted, the spatial layout of the cabinet frame is optimized to obtain a more compact structure, the cabinet has better stability when mounted and used, the whole cabinet frame provides more reliable support, the cabinet frame without the cross beams fulfills more convenient and flexible cable arrangement, and the truckle structures are mounted at the corners of the cabinet frame, so that mounting convenience, firmness, and reliability are achieved.

Particularly, different from a whole cabinet frame on the present market, which is assembled by means of splicing or by means of connection of tee joints or other latches and is provided with a cross beam between every two stand columns 530 to guarantee the support strength of the cabinet frame, the cabinet 500 of the present invention has the top frame and the bottom frame fastened to form a whole independent structure which may be formed by welding profiles; notches (similar to dug notches) are formed in the corners of the independent frame, and the stand columns 530 are exactly closely mounted in the notches and are reliably fixed to the top frame 510/bottom frame 520, in this way, a top-bottom frame structure appearing to be regular and flat is formed after the stand columns 530 are mounted on the top frame 510/bottom frame 520, and the integrally-mounted cabinet frame formed by means of has good strength and rigidity; the stand columns 530 are clamped in the notches and closely fixed to the two mounting surfaces of the corresponding notches, so that the cabinet will not swing even if an external force is applied; if a plurality of cabinets are assembled to form the cabinet system (cabinet device), more stable support is achieved; moreover, it is unnecessary to additionally mount the cross beams in the middle of side faces of each cabinet to improve structural rigidity, cable arrangement, lamp arrangement, and heat dissipation are performed more properly and flexibly; and further, parts, such as cable management frames, for the cable arrangement are arranged in the vertical direction of the cabinets more flexibly, so that the obstruction of the cross beams on the existing cabinet frame is avoided, and a cable arrangement space of the whole cabinet is greatly enlarged.

In the present invention, to guarantee sufficient strength, the cabinet frame is preferably made from a high-strength steel sheet with a thickness equal to or greater than 2.0 MM (preferably a 2.0 MM thick high-strength steel sheet), and the above connection structure is adopted to guarantee 1600 kg load-bearing performance of the single cabinet. Existing conventional cabinets are made from 1.0 MM-1.5 MM thick materials in general, frames are different in structure, and consequentially, a single cabinet has poor load-bearing performance.

In a preferred or optimal embodiment, the mounting notches are right-angled, an included angle between two corresponding first mounting surfaces 5111 is a right angle, an included angle between two corresponding second mounting surfaces 5211 is a right angle, and mounting positions, corresponding to the mounting notches, of the stand columns 530 are square.

The top frame 510 and the bottom frame 520 respectively have four corners, and the mounting notches are respectively formed in the corners.

The cabinet frame formed after the top frame 510, the bottom frame 520, and the stand columns 530 are mounted has a more compact and regular layout, and the stand columns 530 are closely fastened in the corresponding right-angled notches and are reliably fixed to the top frame 510/bottom frame 520, and in this case, corresponding external side faces of the stand columns 530 are closely connected to the corresponding mounting surfaces to limit deformation of the cabinet frame in front, rear, left, and right directions, so that the rigidity of the whole cabinet frame is guaranteed, and strength of the whole cabinet and a whole assembled cabinet is guaranteed. Clearly different from an existing connection manner that the stand columns 530 are connected to the lower side of the top frame 510 and the upper side of the bottom frame 520, and compared with an inserted connection manner, the connection manner in the present invention can limit deformation by means of the cooperation between the stand columns 530 and the right-angled notches, so that the strength and rigidity of the whole structure is better guaranteed.

Further, to prevent mounting positions where the stand columns 530 are closely mounted from being partially swelled relative to the corresponding top frame 510/bottom frame 520, which may otherwise cause unreliable mounting or influence connection reliability, the mounting surfaces are preferably sunk into the corresponding top frame 510/bottom frame 520. By means of such structure, corresponding side faces of the stand columns 530 are reliably closely connected to the corresponding mounting surfaces, the deformation in the horizontal direction is avoided and limited more effectively, the whole cabinet frame can provide stable support without swinging under an external force, and the stand columns 530 closely camped in and fixed to the corners are not prone to loosing.

In the present invention, when a plurality of cabinets are arranged, two adjacent cabinets are closely fixed to each other, in this case, two corresponding top frames 510/bottom frames 520 are in close fit with each other, and are simultaneously mounted together through the stand columns 530 in the middle, and the stand columns 530 on the edge of the whole structure are thin and are only used to connect the independent top frame 510 and the independent bottom frame 520, so that the layout compactness of the whole structure is improved.

Particularly, when the plurality of cabinets are assembled, the independent stand column 530 in the middle can be lengthened in left and right directions, in this case, the stand column 530 is half clamped in the left mounting notch and half clamped in the right mounting notch, one side face of the stand column 530 in a length direction is simultaneously connected to the two corresponding mounting surfaces, and two side faces of the stand column 530 in a width direction are respectively connected to the remaining two mounting surfaces, so that the connection reliability as well as the rigidity of the whole structure are guaranteed; and only one stand column 530 needs to be used in the middle and is in close fit with the top frame and the bottom frame, so that the strength of the whole cabinet system is guaranteed. Compared with an existing connection manner that two stand columns 530 are simply tightened through a connecting fastener, such connection manner has a clear advantage, and the assembled cabinet system is not prone to swinging and is supported stably.

In the present invention, the cabinet system composed of the plurality of cabinets is a whole high-strength rigid structure formed by connecting single cabinets through the special middle stand columns 530 without using additional cabinet connectors (such as connecting fasteners), so that the rigidity and strength of a whole multi-connected cabinet are further improved, and the purchase cost of the cabinet connectors is lowered for the customers. Existing conventional cabinets are simply connected by means of independent cabinet connectors, and consequentially, a whole multi-connected cabinet has poor rigidity.

In the present invention, preferably, the stand columns 530 are hollow and square, no cross beams are mounted at hollow positions of the stand columns 530 and on the whole cabinet frame, so that the cables and hidden lamp belts can be arranged in the hollow positions more conveniently; brackets matched with the cables and other parts can be flexibly arranged in the vertical direction without being obstructed by the cross beams on the existing cabinet frame, so that the cable arrangement space of the whole cabinet is greatly enlarged, and more convenient and flexible mounting is achieved.

In the present invention, to further guarantee the strength and rigidity of the structure, the stand columns 530 are made from galvalume steel sheets. The internal spaces of the stand columns 530 can be 495 MM wide and thus can allow servers of all brands and super-wide and super-large devices to be mounted therein, so that the trouble of users in selecting a size to customize the cabinet is avoided; the stand columns 530 are particularly made from anti-fingerprint galvalume steel sheets and are formed by bending the anti-fingerprint galvalume steel sheets for at least five times (preferably for five times), so that the bending resistance is excellent, no fingerprint will be left when the cabinet device is mounted keep the cabinet clean and beautiful, and rigidity of the stand columns 530 can be greatly improved to guarantee safety of the cabinet device in use.

With regard to conventional cabinet devices, internal spaces of stand columns 530 are 480 MM wide, as a result, part of servers and widened devices cannot be mounted normally. Conventional stand columns are bent for only one to three times, and the bending resistance is poor; and consequentially, the stand columns 530 will be deformed after being used for a long time and frequently shaken.

Further, different from the conventional stand columns 530 having poor bending resistance and prone to deformation, the stand columns 530 can be bent for multiple times, so that strength and rigidity of a whole structure of the stand columns 530 are guaranteed; the cross beams can be omitted when the stand columns 530 are used for the cabinet frame or the cabinets, so that the parts are mounted more flexibly, the spaces are widened.

In summary, the cabinet of the present invention comprises the top frame 510, the bottom frame 520, and the stand columns 530 for connection, wherein the vertically arranged stand columns 530 are closely connected to the 90° notches in the corners of the frame and are especially in close fit with the mounting surfaces of the notches, so that the strength and rigidity of the whole structure are guaranteed, and the deformation is limited; the stand columns 530 can be bent for multiple times, so that the strength is guaranteed; the whole cabinet frame has no beam support structure (in the horizontal direction), so that the parts can be mounted and distributed in the vertical direction more conveniently, and the cable management frames, the cable arrangement brackets, and other parts are facilitated to be mounted; the hollow positions of the stand columns 530 can be used more conveniently in storing and arranging the cables and arranging the hidden lamp belts, so that the layout is more proper, and the whole cabinet is more compact; the cable management frames and other parts are directly mounted on the stand columns 530 more flexibly and conveniently, and the cabinet system is formed by closely assembling the plurality of cabinets, so that the strength and rigidity of the whole structure are guaranteed; and especially, the stand columns 530 can be simultaneously connected the two corresponding top frames 510/bottom frames 520, the connection reliably and the overall support strength are guaranteed. Clearly different from the existing stand columns 530 for connecting two cabinets by means of the connecting fasteners as well as a cabinet system having low overall strength, the whole cabinet system has more compact and stable layout.

In the present invention, the cabinet 500 is designed by means of the above frame without unnecessary cross beams; the stand columns 530 of the frame are designed to form cable arrangement channels and device installation channels everywhere. In this way, a 600 wide multi-connected cabinet can be mounted with a vertical cable arrangement groove to have a cable arrangement capacity of a common 800 wide cabinet, a super-large cable arrangement capacity and a super-large device installation space can be achieved, and the device installation space is not shielded, so that construction and maintenance are greatly facilitated.

Most conventional cabinets have the cross beams which obstruct device and cable arrangement channels, resulting in a small cable arrangement space; and if vertical cable grooves are formed, a device operation space will be influenced, and consequentially, subsequent maintenance and construction will be severely influenced. To obtain a large cable arrangement capacity of the conventional cabinets, it is necessary to customize the cabinets to widen cabinet bodies in general, and consequentially, the user cost is greatly increased.

The specific embodiments described herein are only used for illustratively explaining the spirit of the present invention. Various modifications, supplements, or similar substitutions of these specific embodiments can be made by those skilled in the art without deviating from the spirit of the present invention and the scope defined by the appended claims of the present invention.

What is claimed is:

1. A truckle structure, comprising:
   a truckle including a mounting base and a wheel which is rotatably mounted on the mounting base;
   a support composed of a mounting portion located at a lower position as well as two connecting portions respectively located on two sides of the mounting portion, wherein the two connecting portions are formed in a manner that a left side and a right side of the mounting portion are upwards bent towards a middle, the support is rotatably connected to the mounting base through the two connecting portions, and the mounting base is located between the two connecting portions; and a mounting hole is formed in the mounting portion, center of the mounting hole and center of gravity of the truckle are on a same straight line, and center of gravity of the support deviates from the straight line.

2. The truckle structure according to claim 1, wherein the mounting base has flat side faces, and upper portions of the connecting portions are formed as flat plates which correspondingly abut against the flat side faces of the mounting base.

3. The truckle structure according to claim 1, wherein the two connecting portions of the support are rotatably connected to the mounting base through a screw rod.

4. The truckle structure according to claim 1, wherein latch holes are coaxially formed in the mounting base and the connecting portions respectively.

5. A cabinet, comprising the truckle structure according to claim 1.

6. The cabinet according to claim 5, independent truckle structures are respectively mounted at corners of the cabinet, and mounting bases are detachably connected to the corners of the cabinet.

7. A cabinet, having at least one corner detachably provided with the truckle structure according to claim 1.

8. A cabinet, having at least one corner detachably provided with the truckle structure according to claim 1, and comprising:
   a top frame having corners respectively formed with first mounting notches, wherein each said first mounting notch has two first mounting surfaces connected to the top frame;
   a bottom frame having corners respectively formed with second mounting notches in one-to-one correspondence with the first mounting notches, wherein each said second mounting notch has two second mounting surfaces connected to the bottom frame; and
   stand columns used to connect the top frame to the bottom frame and in one-to-one correspondence with the first mounting notches, wherein mounting positions of the stand columns are matched with the mounting notches in shape; and one said stand column is mounted between each said first mounting notch and the corresponding second mounting notch, so that the stand column is closely connected to the corresponding first mounting surface and the corresponding second mounting surface.

9. The cabinet according to claim 8, wherein the mounting notches are right-angled, an included angle between two corresponding first mounting surfaces is a right angle, an included angle between two corresponding second mounting surfaces is a right angle, and mounting positions, corresponding to the mounting notches, of the stand columns are square.

10. The cabinet according to claim 9, wherein the top frame and the bottom frame respectively have four corners, and the mounting notches are respectively formed in the corners.

11. The cabinet according to claim 8, wherein the mounting surfaces are sunk into the corresponding top frame/bottom frame.

12. The cabinet according to claim 8, wherein the stand columns are hollow.

13. The cabinet according to claim 8, wherein the stand columns are made from steel sheets.

14. The cabinet according to claim 8, wherein the stand columns can be bent for multiple times.

15. The cabinet according to claim 8, wherein when a plurality of cabinets are arranged, two adjacent said cabinets are closely fixed to each other, and in this case, two corresponding top frames/bottom frames are in close fit with each other, and are simultaneously mounted together through the stand columns in the middle.

\* \* \* \* \*